United States Patent [19]

Cima et al.

[11] Patent Number: 5,387,380
[45] Date of Patent: Feb. 7, 1995

[54] THREE-DIMENSIONAL PRINTING TECHNIQUES

[75] Inventors: Michael Cima, Lexington; Emanuel Sachs, Somerville; Tailin Fan, Cambridge; James F. Bredt, Watertown; Steven P. Michaels, Melrose; Satbir Khanuja, Cambridge; Alan Lauder, Boston; Sang-Joon J. Lee, Cambridge; David Brancazio, Cambridge; Alain Curodeau, Cambridge; Harald Tuerck, Cambridge, all of Mass.

[73] Assignee: Massachusetts Institute of Technology

[21] Appl. No.: 894,100

[22] Filed: Jun. 5, 1992

Related U.S. Application Data

[63] Continuation-in-part of Ser. No. 447,677, Dec. 8, 1989, Pat. No. 5,204,055.

[51] Int. Cl.⁶ .............................................. B29C 67/00
[52] U.S. Cl. .................................... 264/69; 264/109; 264/123; 264/128; 264/308; 425/130; 425/218; 425/425
[58] Field of Search ................... 264/63, 69, 71, 109, 264/113, 123, 128, 308; 425/130, 218, 425; 222/171

[56] References Cited

U.S. PATENT DOCUMENTS

| | | | |
|---|---|---|---|
| 4,575,330 | 3/1986 | Hull | 425/174.4 |
| 4,665,492 | 5/1987 | Masters | 364/468 |
| 4,791,022 | 12/1988 | Graham | 428/324 |
| 4,929,402 | 5/1990 | Hull | 264/22 |
| 5,121,329 | 6/1992 | Crump | 364/468 |
| 5,147,587 | 9/1992 | Marcus et al. | 264/22 |
| 5,204,055 | 4/1993 | Sachs et al. | 419/2 |

*Primary Examiner*—Mary Lynn Theisen
*Attorney, Agent, or Firm*—Robert F. O'Connell; Henry D. Pahl, Jr.

[57] ABSTRACT

A process for making a component by depositing a first layer of a powder material in a confined region and then depositing a binder material to selected regions of the layer of powder material to produce a layer of bonded powder material at the selected regions. Such steps are repeated a selected number of times to produce successive layers of selected regions of bonded powder material so as to form the desired component. The unbonded powder material is then removed. In some cases the component may be further processed as, for example, by heating it to further strengthen the bonding thereof.

58 Claims, 8 Drawing Sheets

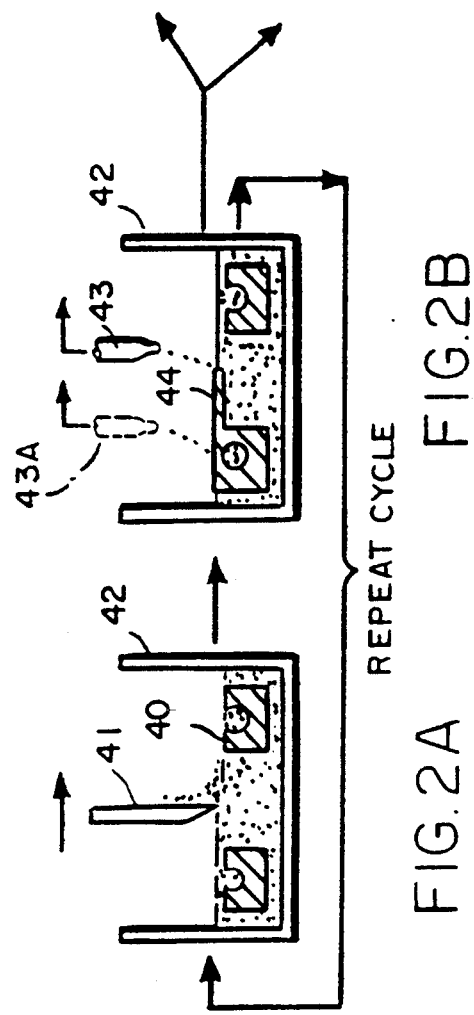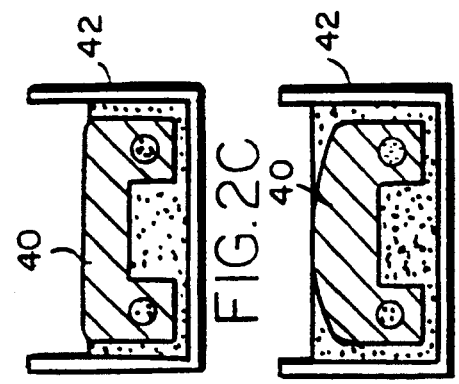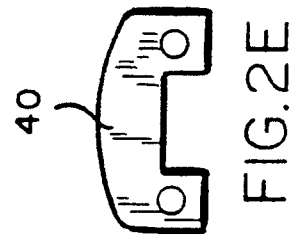

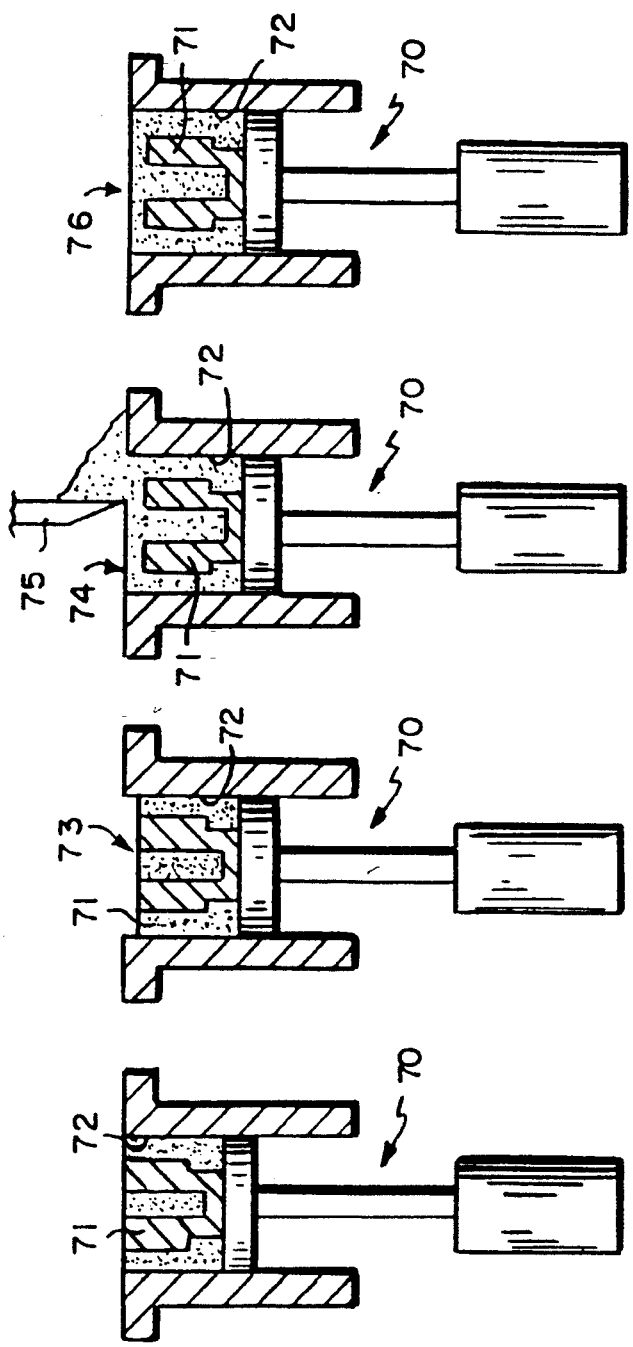

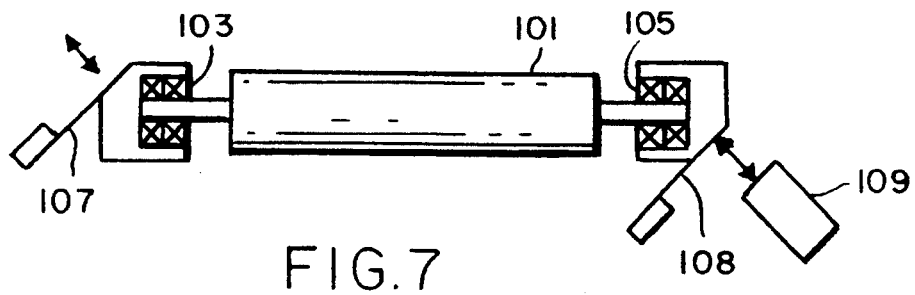
FIG.7
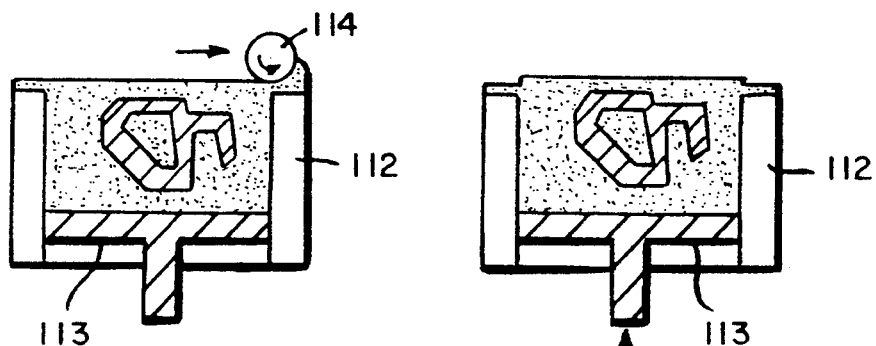
FIG.8A
FIG.8B
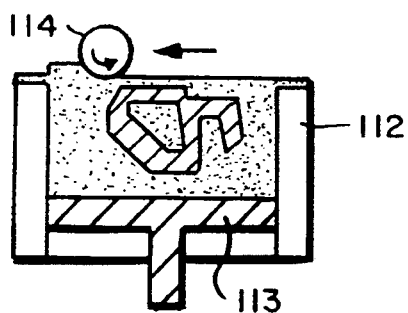
FIG.8C
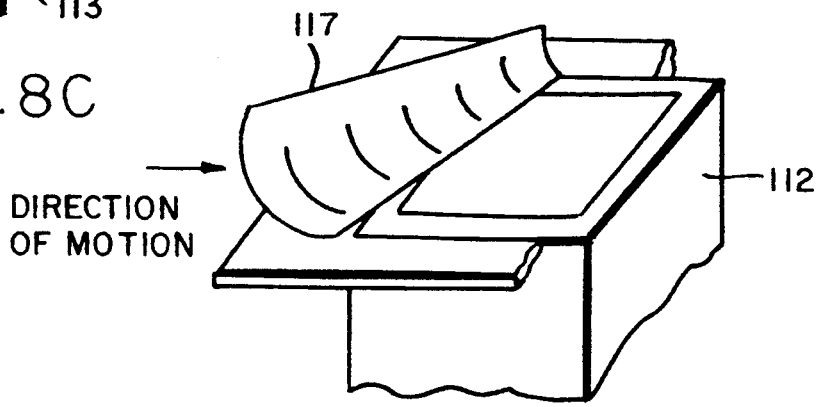
FIG.9

# THREE-DIMENSIONAL PRINTING TECHNIQUES

This invention was made with government support under Grant Number DDM-8913977 awarded by the National Science Foundation. The government has certain rights in the invention.

This is a continuation-in-part of copending application Ser. No. 07/447,677 filed on Dec. 8, 1989, now U.S. Pat. No. 5,204,053.

INTRODUCTION

This invention relates generally to the manufacture of tooling and prototype parts and, more particularly, to the use of three-dimensional printing techniques using computer models therefor.

BACKGROUND

Two needs in providing effective industrial productivity and competitiveness lie in the reduction in time required to bring new products to the marketplace and the need for providing for flexible manufacture of products in small quantities. Thus, it is desirable to provide rapid part turnaround with a minimal investment in tooling. Techniques for doing so should have the ability to tailor designs to specific tasks, to shorten the cycle time from design to manufacturing, and/or to manufacture in very small lot sizes, as low as a single component, all at reasonable cost. A major contributor to the time required to bring new products to market is the time required to fabricate functioning prototypes. Rapid prototyping can shorten the product development cycle and improve the design process by providing rapid and effective feedback to the designer. Moreover, some applications require rapid prototyping of non-functional parts for use in assessing the aesthetic aspects of a design or the fit and assembly thereof.

Another major contributor to the time to bring a product to market is the time required to develop tooling, such as molds and dies. For some types of tooling, such as injection molding dies, the turnaround time for the design and fabrication of a tool routinely extends to several months. The long lead times are due to the fact that tooling is often one of a kind and can be extremely complex, requiring a great deal of human attention to detail. Thus, tooling not only affects lead time, but also manufacturing costs as well. In fact, tooling costs often determine the minimum economic batch size for a given process. Prototyping requirements, tooling lead time, and tooling cost are related in that it is the combination of long lead times and high cost which make it impractical to fabricate preproduction prototypes by the same process that will be used in production.

In the past several years, there has been considerable interest in developing computerized, three-dimensional printing techniques, sometimes referred to as "desktop manufacturing" techniques where no tooling is required. One such system is known, the SLA 1 System, made and sold by 3D Systems, Inc. of Valencia, Calif. This system operates on a principle called stereolithography wherein a focused ultra-violet (UV) laser is vector scanned over the top of a bath of a photopolymerizable liquid polymer plastic material. The UV laser causes the bath to polymerize where the laser beam strikes the surface of the bath, resulting in the creation of a first solid plastic layer at and just below the surface. The solid layer is then lowered into the bath and the laser generated polymerization process is repeated for the generation of the next layer, and so on, until a plurality of superimposed layers forming the desired part is obtained. The most recently created layer in each case is always lowered to a position for the creation of the next layer slightly below the surface of the liquid bath.

An alternative approach, sometimes called Selective Laser Sintering (SLS) has also been proposed by DTM Corporation of Austin, Tex. In such system, a laser beam is used to sinter areas of a layer of loosely compacted plastic powder, the powder being applied layer by layer. The term "sintering" refers to the process by which particulates, such as powdered plastics, are caused to adhere into a solid mass by means of externally applied energy. A SLS system uses the optical energy supplied by a laser for such purpose.

Thus, a thin layer of powder is spread evenly onto a flat surface with a roller mechanism. The thin powder surface is then raster-scanned with a high-power laser beam from above. The powder material that is struck by the laser beam is fused together. The areas not hit by the laser beam remain loose and fall from the part when it is removed from the system. Successive layers of powder are deposited and raster-scanned, one on top of another, until an entire part is complete. Each layer is sintered deeply enough to bond it to the preceding layer. A similar laser sintering approach has been proposed by Hydronetics, Inc. of Chicago, Ill. Another process suggested by the same company is designated as a Laminated Object Manufacturing (LOM) technique wherein thin metallic foil layers are cut out to appropriate shapes to form a part and the shaped layered pieces are laid one on top of the other and suitably bonded to form the part involved.

Another process suggested for creating 3D models and prototypes, sometimes called Ballistic Particle Manufacturing (BPM), has been proposed by Automated Dynamic Corporation of Troy, N.Y. This process uses an ink-jet printing technique wherein an ink-jet stream of liquid molten metal or a metal composite material is used to create three-dimensional objects under computer control, similar to the way an ink-jet printer produces two-dimensional graphic printing. A metal or metal composite part is produced by ink-jet printing of successive cross sections, one layer after another, to a target using a cold welding (i.e., rapid solidification) technique, which causes bonding between the particles and the successive layers.

Still another technique, sometimes called Photochemical Machining, proposed by Formigraphic Engine Co. of Berkeley, Calif., uses intersecting laser beams to selectively harden or soften a polymer plastic block. The underlying mechanism used is the photochemical cross-linking or degradation of the material.

It is desirable to devise a technique for providing such layered parts which will work satisfactorily with ceramic or metal materials, or combinations of such materials with each other or with other materials, but which will also work satisfactorily with plastic particles or with other inorganic materials. Such a technique could be more universally employed for the manufacture of components from a larger variety of materials than the currently proposed techniques.

BRIEF DESCRIPTION OF THE INVENTION

In accordance with a preferred embodiment of the invention, powdered material, e.g., a powdered ceramic, a powdered metal, or a powdered plastic, is deposited in sequential layers one on top of the other. Following the deposit of each layer of powdered material, a liquid binder material is selectively supplied to the layer of powdered material using an ink-jet printing technique in accordance with a computer model of the three-dimensional part being formed. Following the sequential application of all of the required powder layers and binder material to form the part in question, the unbound powder is appropriately removed, resulting in the formation of the desired three-dimensional part. It is found that such technique permits complex metal, ceramic, or metal-ceramic composite parts to be effectively formed with a very high degree of resolution in a reasonably short time period.

Such technique should be particularly useful, for example, in providing for the rapid production of molds for metal casting and the rapid formation of pre-forms for metal matrix composites. Such technique can also be used with plastic materials to form plastic components or parts for various purposes.

DESCRIPTION OF THE INVENTION

The invention can be described in more detail with the help of the accompanying drawings wherein FIG. 1 shows an isometric view of one particular embodiment of the invention;

FIG. 2 shows diagrammatic views of different stages in forming a part in accordance with the invention;

FIG. 6 shows exemplary stages in the use of a drop-piston device for depositing powder particles in accordance with the invention;

Figure 10:
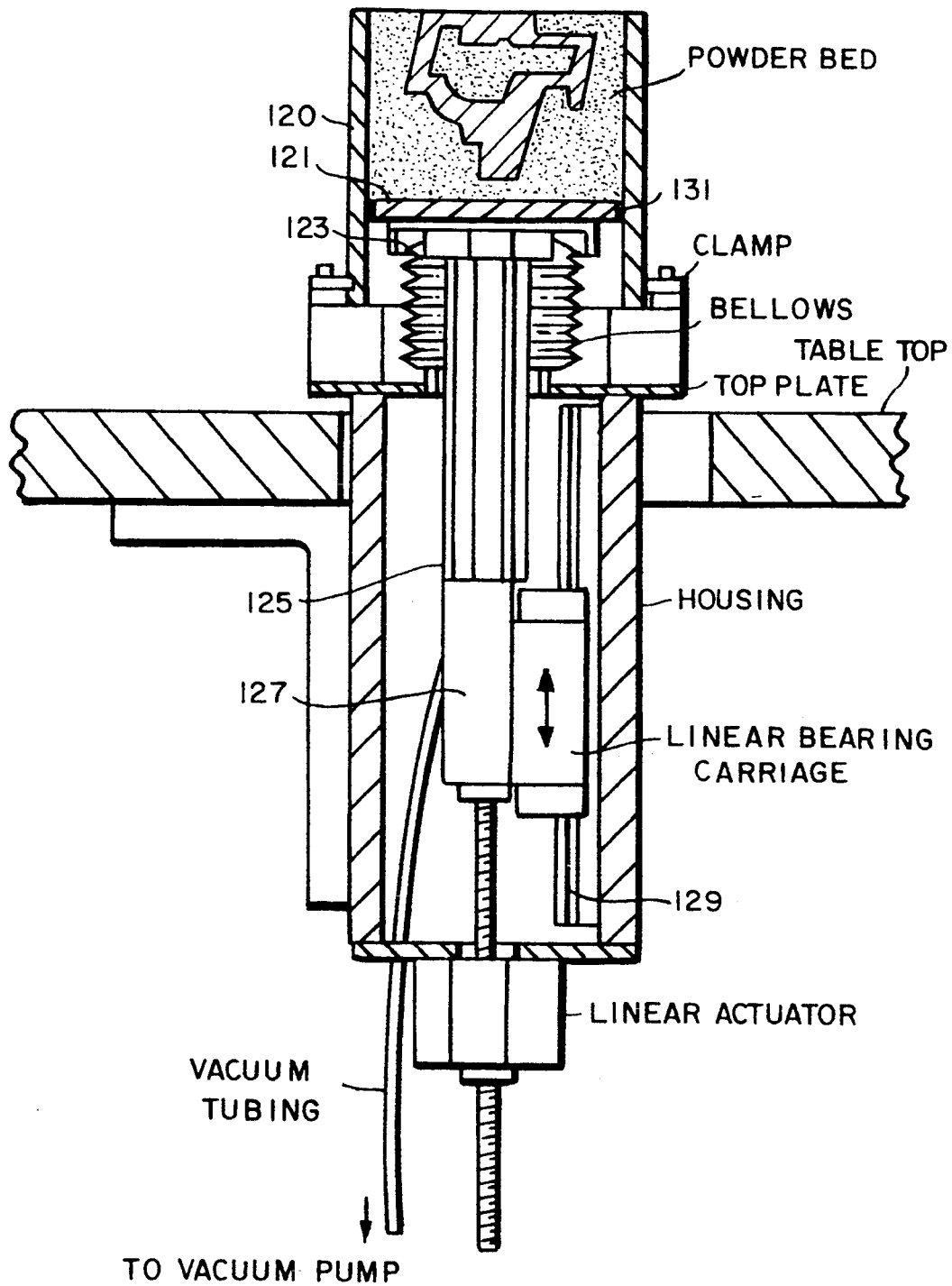
Figure 11:
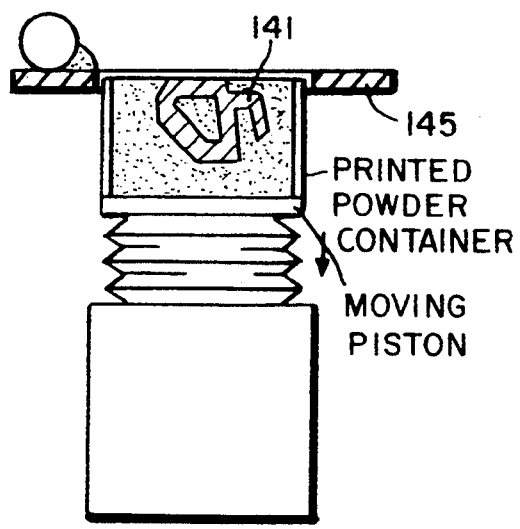
Figure 12:
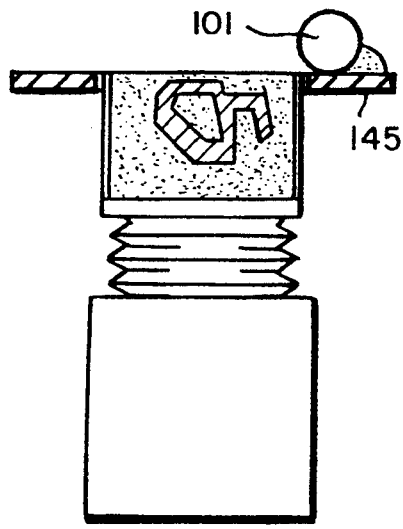
Figure 13:
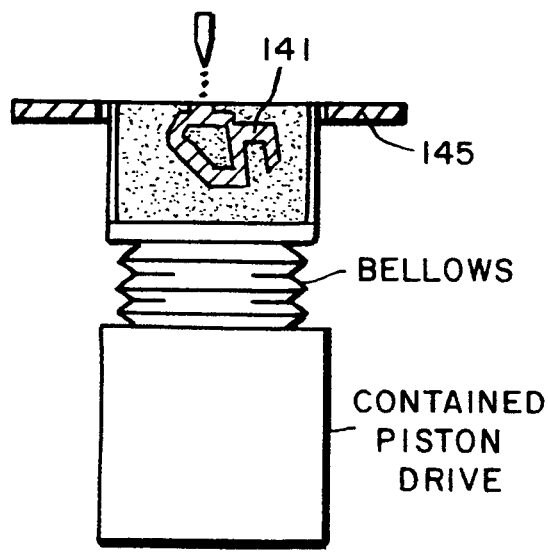
Figure 14:
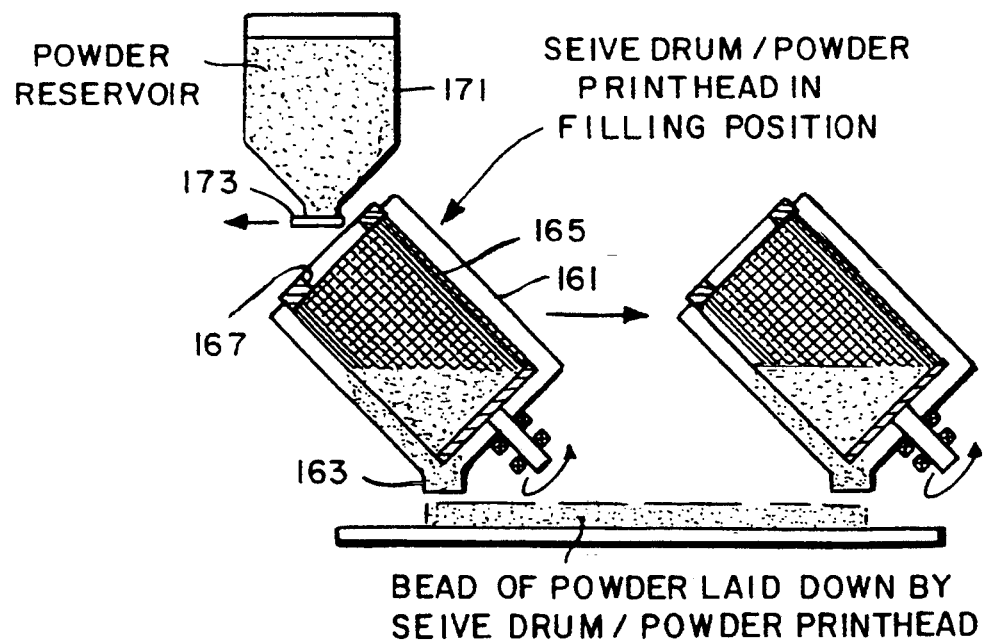
Figure 15:
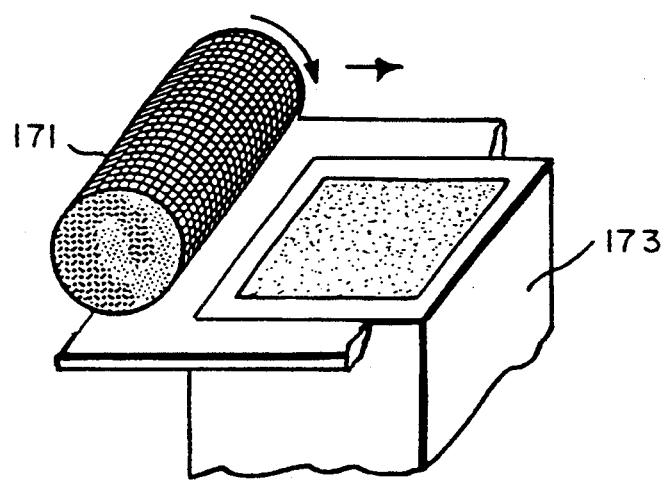

FIG. 7 a diagrammatic illustration of roller apparatus for spreading and compacting a layer of powder;

FIG. 8A-8C illustrate a method of spreading and compacting a layer of powder;

FIG. 9 illustrates doctor blade apparatus for smoothing a layer of powder;

FIG. 10 illustrates a floating piston apparatus useful in printing three-dimensional objects in accordance with the present invention;

FIGS. 11-13 illustrate a method of confining a body of powder material during printing;

FIG. 14 illustrates sieve drum apparatus for laying down a train of powder material; and FIG. 15 illustrates sieve drum apparatus for spreading a layer of powder prior to printing.

Corresponding reference characters indicate corresponding parts throughout the several views of the drawings.

Figure 1:
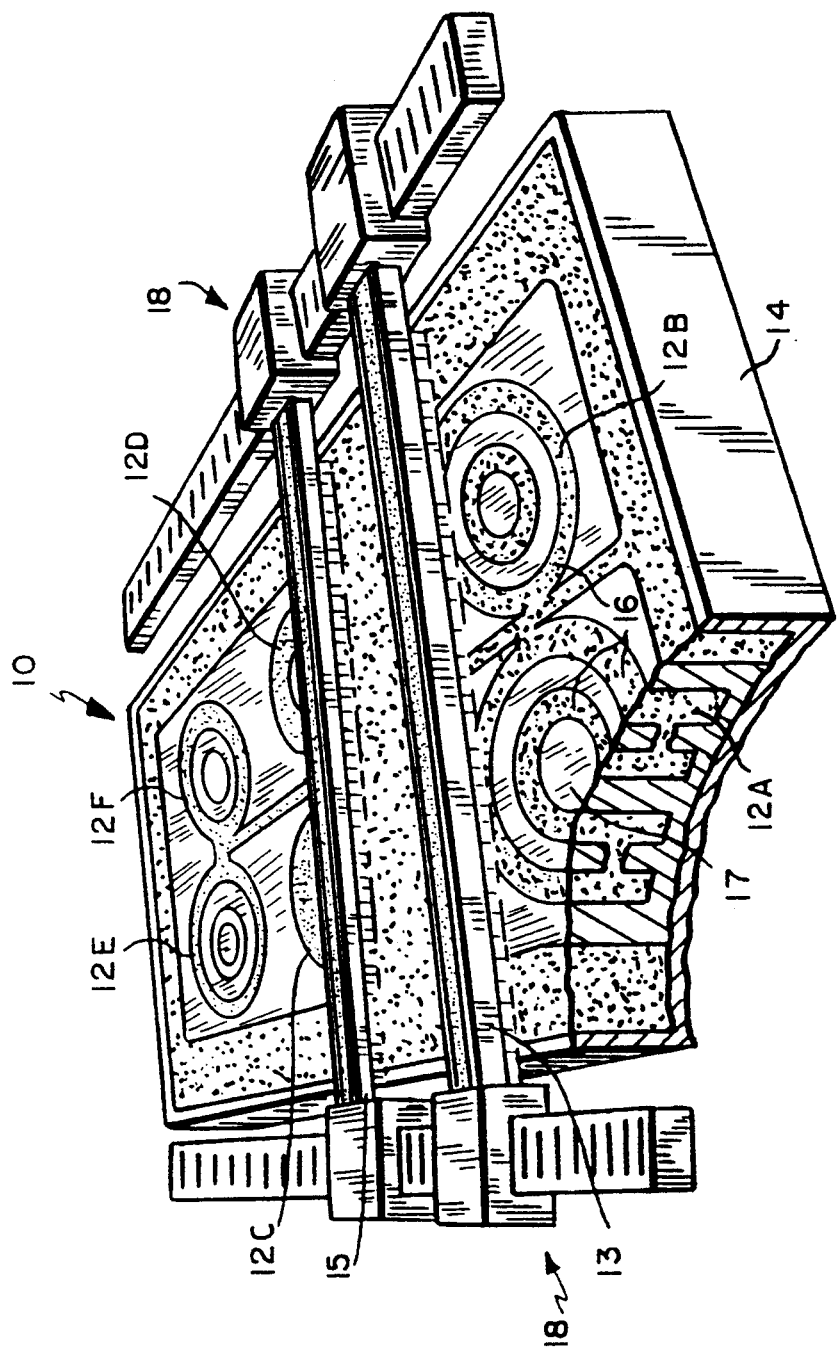

One particular embodiment of the invention is shown in FIG. 1 which depicts an apparatus 10 for forming a ceramic mold having six cavities 12A-12F which can be used for casting six substantially identical parts. A powder dispersion head 13 is driven reciprocally in a shuttle motion along the length of the mold being formed. A suitable linear stepping motor assembly 18 can be used for moving the powder distribution head 13 and the binder deposition head 15 (discussed below). The powdered material, e.g., a ceramic powder, is dispensed in a confined region, e.g., defined by a form 14, the powder being dispensed in a line as the dispensing head 13 is moved in discrete steps along the mold length to form a relatively loose layer thereof having a typical thickness of about 100-200 microns, for example. While the material is described here as a powdered material, in some applications it can be distributed in the form of fibers, for example. For convenience in describing the invention, the term powder material will be construed to include fiber material. The stepping motor can be moved at such high speeds that the motion of the head 13 will effectively be continuous in nature. Alternatively, the motor may be one which inherently provides a continuous motion, such as a servo-controlled motor. An initial layer is dispersed at the bottom of the form 14 and each subsequent layer is dispersed sequentially on the preceding layer.

An ink-jet print head 15 having a plurality of ink-jet dispensers is also driven by the stepping motor assembly in the same reciprocal manner so as to follow the motion of the powder head and to selectively produce jets of a liquid binder material at selected regions 16 which represent the walls of each cavity, thereby causing the powdered material at such regions to become bonded. The binder jets are dispensed along a line of the print-head 15 which is moved in substantially the same manner as the dispensing head 13 of the powder material, i.e., by a high speed stepping operation or by a continuous servo motor operation, in each case providing effectively continuous movement of head 15 as discussed above with reference to head 13. Typical binder droplet sizes are about 15-50 microns, for example. The powder/binder layer forming process is repeated so as to build up the mold parts layer by layer.

A diagram showing a part being fabricated in accordance with the invention is depicted in FIG. 2 which diagrammatically depicts the flow thereof. For a part 40 in question a layer of powder is deposited from a powder dispensing head 41 into a form 42 over a previously formed layer which has already had binder material deposited therein (A). A layer of binder material is then printed onto the powder layer from binding Jet head 43 to form the next layer 44 of bonded powder articles (B). Such operation is repeated for each subsequent layer. An exemplary intermediate stage of the formation of part 40 is shown at (C). When the final bonded layer is printed as shown at (D), excess, unbonded powder is removed, the finally formed part itself being depicted at (E).

While the layers become hardened or at least partially hardened as each of the layers is laid down, once the desired final part configuration is achieved and the layering process is completed, in some applications it may be desirable that the form and its contents be heated or cured at a suitably selected temperature to further promote binding of the powder particles. In either case, whether a further curing is or is not required, the loose, unbonded powder particles, e.g., at regions 17 (FIG. 1), are removed using a suitable technique, such as ultrasonic cleaning, for example, so as to leave a finished part for use.

For effective use, the powder particles should be uniformly deposited at a relatively high rate, the rate being selected in accordance with the application for which the technique is used. For many useful applications the powder particles can preferably be packed at relatively high densities, while in other applications the density may be considerably lower where parts having greater porosity are desired. Known techniques used in the fields of colloidal science and powder dispersion chemistry can be used to provide the desired uniform depositions of such powders at the required rates and densities. Thus, such powders can be dispensed either as dry powders or in a liquid vehicle, such as in a colloidal dispersant or in an aqueous suspension. In the dry state, the desired compaction of particles can be achieved using mechanical vibrating compaction techniques or by applying acoustic energy, i.e., either sonic or ultrasonic vibrations, to the deposited powder or by applying a piezoelectric scraper to the deposited powder.

Figure 3:
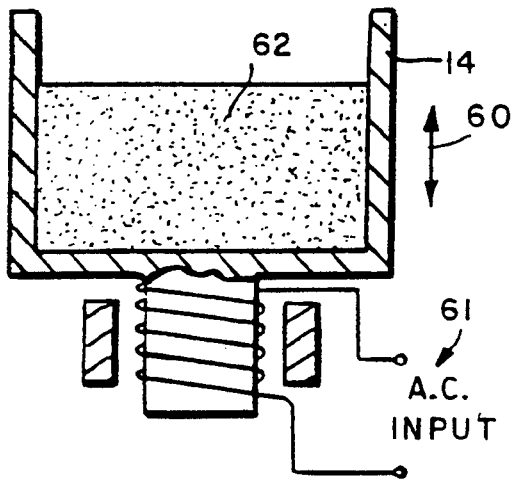
FIG. 3, 4 and 5 show various exemplary techniques for setting the powder particles by applying mechanical vibrations and acoustic energy thereto.
Figure 5:
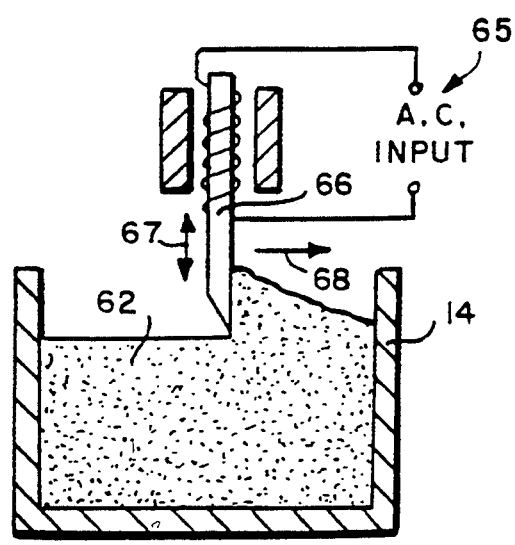
Figure 4:
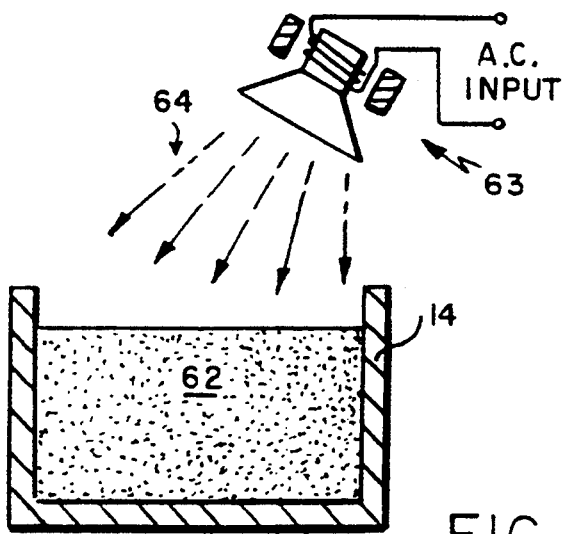

Such techniques are illustrated, for example, in FIGS. 3, 4 and 5, respectively. FIG. 3 shows form 14 which is mechanically vibrated as shown by arrow 60 using a vibrating transducer system 61 for settling the powder particles 62 therein. In FIG. 4 an acoustic transducer system 63 is used to supply acoustic energy 64 to the surface layer of powder 62 for such purpose. In FIG. 5 a vibrating transducer system 65 is used to vibrate a piezoelectric scraper 66 as shown by arrow 67 as it moves in the exemplary direction of arrow 68 to settle the powder 62.

The powder may also be deposited in a dry or in a wet form using a drop piston approach wherein a dry or moist powder is deposited on the top of a vertically movable piston and the piston is moved downwardly into a chamber, excess powder being scraped off with a suitable scraper device.

As shown in FIG. 6, a piston 70 holds the part 71 shown as partially formed within a chamber 72 at diagram (A). In order to deposit a layer of powder, the piston is moved downwardly in the chamber, leaving a region in chamber 73 at the top thereof for deposition of powder particles at diagram (B). Powder particles 74 are deposited in such region and a doctor blade 75, for example, is used to scrape off excess powder at diagram (C). The part 71 having the newly deposited layer 76 of powder thereon is then ready for the application of binder material thereto at diagram (D).

A mechanism for simultaneously leveling and densifying or compacting a powder is illustrated in FIG. 7. In this mechanism, a horizontal roller 101 is mounted for both rotation and vibration simultaneously. The end shafts of the roller 101 are mounted in bearings 103 and 105 which are in turn mounted on leaf springs inclined at an angle of about 45 degrees to the vertical. Roller 101 is driven in rotation by a suitable motor (not shown) and the entire roller system is vibrated by an electromagnetic driver designated generally by reference character 109. To smooth the powder layer, the roller is translated across the surface of the newly deposited layer so as to smooth and compact it. As will be understood, the vibration will thus have a component which is longitudinal to the roller and also a component which is vertical or normal to the powder layer and thus aids in densification or compaction of the powder. Preferably, the rotation of the roller is counter to the direction of the translation so that excess powder is driven ahead of the roller during the spreading step. For maximum smoothness, it may be advantageous to first scan the roller with vibration and then to scan it using only rotation so as to achieve the smoothest possible top surface.

Where significant compaction is desired, it is appropriate to raise the piston holding the powder mass and part being formed, after the spreading and prior to compaction. Such a procedure is illustrated in FIGS. 8A–8C. In FIG. 8A, newly deposited powder is spread across the top of the powder mass which is confined within a cylinder 112 and supported by piston 113 using a roller 114 which is traversed across the printing region (from left to right as shown) and is rotated in a direction opposing the traversing (counterclockwise as shown) so as to drive excess powder ahead of the roller.

After spreading, the piston is raised by an amount corresponding to the degree of compaction desired as shown in FIG. 8B. Then the roller 114 is traversed back across the printing region which the direction of rotation corresponding to the traversing motion so that the newly spread powder layer is compacted as illustrated in FIG. 8C. An alternative to the rolling step of FIG. 8C would be to use a flat platen which is pressed down on the newly spread layer. As will be understood, deformation must be limited to the top layer only, since previously built portions of the part could be distorted by pressing. Fortunately, granulated systems transform from plastic to elastic behavior over a relatively narrow range in compaction density. Thus, deformation during compaction can be expected to be limited to the top layer if a minimum density is established during the build process. Many opportunities exist for materials design to insure that compaction is limited to the topmost layer. Many powder pressing operations use granulated powder to improve flowability. The granules are typically prepared by spray drying and are composed of fine particles and organic binder. The binder is heavily plasticized so that they deform easily upon pressing. Pressed bodies exhibit surprisingly uniform packing density because the granules exhibit highly nonlinear mechanical characteristics. The final body would be essentially a dry pressed component formed by lamination. Dry pressing is known to control particle packing well if the dimensions of the body are small in the direction that the load is applied. Removal of the printed component would be achieved by using a water soluble binder for the spray dried granules and a latex binder for the ink jet printing. Sonication of the laminated structure in water would then only remove the excess material since the dried latex will not redisperse in water.

An alternative approach is to accomplish densification or compaction by spraying a small amount of liquid on the surface which allows the particles to repack during drying. An example is to spread alumina particles in the 0.5–5 micron range and then to spray or mist water onto the spread layer. The water will cause the particles to rearrange and repack, resulting in a high density layer. If a small amount of water is used, there will be no need to dry the layer before printing. If a larger amount of water is used, the layer may have to be partially dried before printing.

While spreading by means of a roller is appropriate in many situations, some materials are better spread with a doctor blade as mentioned previously. An improved form of doctor blade is illustrated in FIG. 9. The doctor blade, designated by reference character 117, has a shape which can be best described as a snowplow configuration, that is, the surface facing the material to be spread is concave, terminating in an edge which contacts the printing region. Acordingly, as the blade is traversed across the printing region, excess deposited powder is in effect cleaved from the powder mass and rolled ahead of the advancing blade.

An improved form of piston mechanism is illustrated in FIG. 10. While a piston guided by the cylinder walls is workable in many situations, the piston can be prone to jamming or sticking as powder particles enter the sliding interface between the piston and the cylinder. In the mechanism of FIG.10, a separate means is provided for aligning the piston within the cylinder and provides an appreciable gap between them. In FIG. 10, the cylinder is designated by reference character 120 the plate which carries the powder bed, i.e. the piston, is designated by reference character 121. The plate 121 is secured by means of a vacuum chuck 123 on one end of a plunger 125. The other end of the plunger is mounted on a carriage 127 which runs along a linear bearing 129. The linear bearing system provides precise location of the piston plate 121 within the cylinder 120 independently of any contact between those parts. Vertical movement of the piston is controlled by a linear actuator 130. The gap between the piston and the cylinder is filled by a fiber seal 131. The seal does not have to be an absolute one. If some powder leaks past the seal, no harm is done but, rather, it can be cleaned from the space below the piston after printing is completed. Escape of any powder from the piston area to the linear bearing and carriage is blocked by a bellows seal 133. In some instances, it may not be necessary to provide any compliant seal at all since the natural bridging tendency of the powder may be sufficient to prevent the escape of excessive quantities.

A further advantage of this construction is that the piston plate 121 and cylinder 120 form a modular unit which, after the printing process, can be removed from the drive mechanism with the printed part in place in the powder bed. This modular unit can then be fired in the furnace and the component removed from the powder bed after firing. In this manner, a delicate part can be fired before it is disturbed. As will also be understood, multiple such modular units can be used so that one part can be printed while another part is being fired.

Provided the binder material being printed hardens sufficiently, the need for providing a cylinder wall for the entire depth of the printed volume may be avoided by, in effect, printing a confining wall member. Such a procedure is illustrated in FIGS. 11-13. In addition to printing the part 141 which is to be formed, the printhead also prints a wall or container around the periphery of the powder bed. The printing of the peripheral wall is performed stepwise in the same manner as the printing of the part. At each stage, the piston 143 is moved down an increment with respect to a stationary platen 145 as illustrated in FIG. 11 and then a new layer of powder is spread over the bed as illustrated in FIG. 12. The spreading may, for example, be performed by the rotating and vibrating cylinder mechanism illustrated in FIG. 7. The platen 145 includes an opening which loosely confines the just spread powder layer. After spreading, a printing step is performed as illustrated in FIG. 13 during which the ink jet 151 deposits binder material, not only as required for forming of the part, but also for building up a peripheral wall 144 spaced slightly inwardly from the edge of the platen opening as illustrated. When the piston plate is then dropped the next increment, the newly printed peripheral wall portion serves to confine the powder bed below the opening in the platen.

While FIGS. 11-13 assume that the powder bed is moved downward with respect to a fixed platen, it should be understood that essentially the same manner of producing a supporting peripheral wall can be utilized where the platen and associated powder spreading and printing mechanisms are moved upwards, i.e. with respect to a stationary base which supports the powder bed including its incrementally formed peripheral wall. This latter arrangement may be of particular utility where the part being formed is particularly massive and it is easier to raise the platen and printing components rather than lower the powder bed.

It should also be understood that, in some circumstances, it may be useful to print a peripheral wall member even though a cylinder is used to confine the powder during printing. The peripheral wall member so formed can facilitate handling of the component after removal from the cylinder, e.g., prior to final heat treatment or sintering.

An improved mechanism for laying down the bead of powder which is then spread across the powder bed is illustrated in FIG. 14. The mechanism illustrated employs a powder dispensing head which is in the form of an inclined cylindrical housing and which can be traversed across one edge of the printing region with powder being dispensed through an outlet 163. Within the cylindrical housing 161 is a rotatable drum 165. The cylindrical wall of the drum 165 is constructed of a suitable screen or sieve material and the drum is journaled for rotation around its longitudinal axis. The lower end of the drum is preferably solid and closed off, as illustrated, while the upper end of the drum includes an opening 167 through which the material to be spread can be introduced into the interior of the drum. A suitable source reservoir is indicated generally by reference character 171, the reservoir being provided with a valve 173 which can be opened to introduce the material into the drum when the dispenser is at the end of its travel, i.e. the left hand end as illustrated.

Once a suitable quantity of the powder material has been introduced into the drum 165, rotation of the drum is initiated along with traversing motion across the edge of the print region. The speed of rotation is selected so that the material contained is tumbled but not held against the surface of the drum by centrifugal force. Likewise, the size of the screening is selected in relation to the size of the powder particles so that material is ejected only when the drum is rotated. The rate at which the material is dispensed from the mechanism can be adjusted by progressively occluding parts of the screen, e.g. by means of an imperforate sleeve which fits over the sieve material. The amount dispensed along the line of powder being laid down can also be adjusted or profiled by varying the speed at which the dispensing head is traversed. For example, if it is found desirable to deposit more powder at the beginning and end of the line, this may be accomplished by moving the dispensing head more slowly in these areas.

An alternative arrangement is to provide a sieve drum which is as long as the width of the print region and to traverse it with rotation across the printing area so as to lay down an essentially uniform layer. Such an arrangement is illustrated in FIG. 15. An elongate sieve drum, designated generally by reference character 171, is mounted on a carriage (not shown) which allows the drum to be traversed and rotated across the printing area, i.e. over the top of a piston and cylinder mechanism 173, which may, for example, be of the typedescribed in greater detail with reference to FIG. 10.

In general, it is found that larger particles, for example, of about 20 microns or greater in size, are preferably deposited in a dry state, while smaller particles, for example, of about 5 microns or smaller in size, can be deposited either in a dry state or in a wet state in a liquid vehicle.

Colloidal dispersions of particles can be obtained in a liquid vehicle by the addition of chemical dispersants. The liquid used in a wet powder dispersion technique is removed, or partially removed, before the next layer is deposited. Thus, such liquid is caused to evaporate rapidly before the ink-jet binder printing occurs. Such evaporation can be achieved, for example, by using infra-red heating, hot air heating or microwave heating techniques.

The ink-jet printing of the binder material should utilize droplets of materials the shrink characteristics of which are selected so that the dimensional tolerances of the part being made are maintained upon hardening thereof. While the binder solution must have a relatively high binder content, the viscosity thereof should be low enough so as to be able to flow through the printing head for deposit into the powder material. The binder material should be selected to penetrate the layer and to perform its binding action relatively rapidly in each layer so that the next layer of powder particles can be subsequently applied thereto. When using certain ink-jet technology the binder material may require at least a minimum electrical conductivity, particularly when using currently available continuous jet printing heads, for example, which require enough conductivity to establish charge on the binder solution droplets as they are emitted from the head. Where conductivity cannot be established in the binder, as with certain organic solvents, for example, the binder can be applied using drop-on-demand print heads.

The binder material may be such that the bonded particles have a high binding strength as each layer is deposited so that, when all the layers have been bonded, the component formed thereby is ready for use without further processing. In other cases, it may be desirable, or necessary, to perform further processing of the part. For example, while the process may be such as to impart a reasonable strength to the component which is formed, once the part is formed it can be further heated or cured to further enhance the binding strength of the particles. The binder in some cases can be removed during such heating or firing process, while in others it can remain in the material after firing. Which operation occurs depends on the particular binder material which has been selected for use and on the conditions, e.g., temperature, under which the heating or firing process is performed. Other post-processing operations may also be performed following the part formation. The rate at which a ceramic, metal, plastic, or composite component can be made depends on the rates used to deposit the powder and to supply the binder liquid, and on the rate at which each bonded layer hardens as the layers are deposited one on the other.

If a dry powder dispersion is utilized, the powder application step is less significant as a limiting factor in determining the overall printing rate. If powder dispersion in a liquid vehicle is used, however, the layer must be at least partially dry prior to the ink-jet application of the binder material. The drying time will depend on the specific nature of the powder, binder, and solvent used.

The dimensions of the individual portions of the component being formed, sometimes referred to as the "feature" size thereof, is primarily dependent on the size of the binder droplets used, while the tolerance on such dimensions primarily depends on the degree of the reproducibility of the droplet spread characteristics of the binder material which is utilized.

Ink-jet printing of a liquid binder using currently known ink-jet devices can provide jet droplet sizes of as low as 15 microns, for example. It is possible that even smaller droplet sizes will be practical, with the lower limit on droplet size arising from surface energy considerations in the creation of new surface area and in the increased likelihood of the clogging of small jets.

Overall part tolerance will depend not only on drop spreading, but also on material shrinkage and the reproducibility of shrinkage characteristics as well. As an example, if the binder/powder combination shrinks by 1% and the shrinkage is reproducible to within 5% of its nominal value of 1% an overall variation due to shrinkage can be approximately 0.0005 inches/inch. The actual shrinkage that occurs during binder curing or deposition is a relatively strong function of particle rearrangement. Dimensional tolerance and particle packing can be empirically determined for the best results in each case.

Alumina, zirconia, zircon (i.e., zirconium silicate), and silicon carbide are representative ceramic materials which can be bonded using the techniques of the invention. Both natural and synthetic dispersants are available for these materials in organic vehicles. For example, alumina is very effectively dispersed by glyceride surfactants in toluene/MEK solvents, as is used for casting thin sheets of particles in the production of dielectric substrates in the electronic packaging industry. Silicon carbide, for example, can be easily dispersed in hexane if small amounts of OLOA 1200 (as obtained, for example, from Chevron Chemical Co. Oronite Additives Div. of San Francisco, Calif.) are present. OLOA is primarily used as an additive in crank case oil where it acts as a dispersant for metal particles produced by engine wear. Organic binders have been used in the ceramics industry and are typically polymeric resins obtained from a variety of sources. They can be either water soluble, such as celluosic binders, as used in extrusion technology, or they can be soluble in only volatile organic solvents, such as the butyral resins, as used in tape casting technology. The latter water soluble systems can be removed relatively quickly and seem particularly useful in the technique of the invention. Another type of organic binder would be a ceramic precursor material such as polycarbosilazane.

Inorganic binders are useful in cases where the binder is to be incorporated into the final component. Such binders are generally silicate based and are typically formed from the polymerization of silicic acid or its salts in aqueous solution. Another exemplary inorganic binder which can be used is TEOS (tetraethylorthosilicate). During drying, the colloidal silica aggregates at the necks of the matrix particles to form a cement-like bond. During firing, the silica flows and acts to rearrange the matrix particles through the action of surface tension forces and remains after firing. Soluble silicate materials have been used as binders in refractory castable materials, for example, and have the advantage, when used in the technique of the invention, of producing substantially the same type of molded refractory body that is used in the casting industry.

In some applications, it may be preferable that the binder harden relatively rapidly upon being deposited so that the next layer of particles placed on a surface of the previous layer is not subject to particle rearrangement due to capillary forces. Moreover, a hardened binder is not subject to contamination from solvents which may be used in powder deposition. In other cases, it may not be necessary that the binder be fully hardened between layers and a subsequent layer of powder particles may be deposited on a previous layer which is not yet fully hardened.

Where hardening occurs at the time the binder is deposited, thermal curing, i.e., evaporation of the binder carrier liquid, for such purpose would generally require that the component being formed be warmed as the printing of the binder material is performed, while the printhead itself is cooled so that unprinted binder material in the reservoir of the ink-jet head retains its desired properties. Such hardening can be achieved by heating the binder material indirectly, as by heating the overall apparatus in which the part is being formed using an appropriate external heat source, for example, or by heating the binder material directly as by applying hot air to the binder material or by applying infra-red energy or microwave energy thereto. Alternatively, a variety of thermally activated chemical reactions could also be used to harden the binder. For example, gelation of alkali silicate solutions can be made to occur by a change in pH accompanying the decomposition oforganic reagents. Thus, a mixture of alkali silicate and formamide could be printed on to a hot component being formed. The rapid increase in temperature would greatly increase the formamide decomposition rate and, therefore, rapidly change the pH of the binder. Other thermally or chemically initiated techniques for hardening of the binder upon deposit thereof could be devised within the skill of those in the art. For example, when making refractory ceramic bodies for use as molds for metal casting, a ceramic powder may be spread and joined by printing of colloidal silica such as Nyacol 830 from Nyacol Corp. of Ashland, Mass. This material is an alkaline formulation of colloidal silica and it can be caused to flocculate and gel by lowering its pH through exposure to an acid. An acid component can be added to the powder so that when the colloidal silica is printed and it hits the powder it will gel. For example, citric acid can be granulated and added to an alumina powder bed in order to promote gelation. Such gelation will occur rapidly upon printing of the colloidal silica. Such rapid gellation will allow for the rapid spreading of the subsequent layer and will also serve to quickly lock the binder in place, thereby preventing any possible bleeding of the binder in the powder bed. Such bleeding might lead to a loss of definition of the part surface and part dimensions. As an alternative to being incorporated into the powder as spread, the gellation inducing material, e.g. acid, could be sprayed onto the powder layer before printing thereof.

While liquid and colloidal binder materials have been discussed above, in some applications binder material may be deposited in the form of binder particles entrained in aliquid. Such binder materials can be supplied via specially designed compound ink-jet structures capable of providing such entrained binder materials. An example of such a composite structure is discussed, for example, in the article "Ink-Jet Printing," J. Heinzle and C. H. Hertz, Advances In Electronics and Electron Physics, Vol. 65.

Direct printing of high solids loaded material is particularly attractive because of the potential of high packing density, improved surface finish, and microdesigned structures. For example, particles of size 0.5 to 0.8 m were selected from an alumina suspension (Reynolds RC-DBM 172) using semicontinuous centrifugal classification. The pH of the slurry thereby obtained was maintained at 3.6 by the addition of nitric acid so as to keep the alumina particles dispersed at a 20% volume suspension. This slurry was then printed onto alumina powder layers through a 60 mm ceramic nozzle a flow rate of 1.5 cc/min.

Moreover, in some applications in the fabrication of a part, the binder material which is used need not be a single binder material, but different binder materials can be used for different regions of the part being formed, the different materials being supplied by separate binder deposition heads. A dual head system is shown in FIG. 2 wherein a second head 43A is depicted in phantom therein at (B).

Many possible combinations of powder and binder materials can be selected in accordance with the invention. For example, ceramic powders or ceramic fibers can be used with either inorganic or organic binder materials or with a metallic binder material; a metal powder can be used with a metallic binder or a ceramic binder; and a plastic powder can be used with a solvent binder or a plastic binder, e.g., a low viscosity epoxy plastic material. Other appropriate combinations of powder and binder materials will occur to those in the art for various applications.

Use of spherical powder offers special advantages for 3D printing. Spherical powders are known for producing low cohesive strength powder assemblies or powders with small internal friction. This gives such powder unusually good flow properties. Faceted or anisotropic powders tend to stick much more and are therefore, much more difficult to spread into thin layers. The increased internal friction exhibited by such powders is related to much more frequent interparticle contact over what is found in spherical powders. Improved flowability also helps when metering constant volumes of powder to the spreader mechanism in the 3D Printing machine. High flowability powder tends not to become clogged in delivery systems. Most often these clogs are associated with bridges that form across constrictions in the flow. Spherical powders often exhibit "mass flow" characteristics through such constrictions where the powder flows much like a fluid and does not have large volumes that are stagnant with respect to the flow. While spherical powders are not necessary to practice 3D Printing, they clearly offer certain process advantages over commonly used powders forforming operations like dry pressing. One means for providing spherical particles which are highly flowable is to use the techniques of spray drying which result in spherical agglomorates consisting of small powder particles held together by a binding agent.

With certain materials, particularly those that are highly flowable such as powders comprising essentially spherical particles, it may be desirable to provide some strengthening of each successive layer spread prior to its being printed. This strengthening allows the powder layer to resist cratering and splattering of the powder caused by the ballistic impact of binder droplets. It also aids in preventing the formation of voids which can be caused when the capillary stress of the liquid binder being drawn into the powder layer is greater than the cohesive strength of the powder layer.

Suitable strengthening may, for example, be obtained by linking the particles in the spread layer employing some mechanism which is weaker or less permanent than the binding mechanism which is implemented by the printing process itself. One method of establishing such a linking is by the application of energy to form a bond between adjacent particles in the layer. For example, if the powder layer comprises a composite of alumina and wax, flash heating may be employed to fuse the wax in the topmost layer so as to form a porous matrix. Printing with a binder of colloidal silica defines the part, as in the previous examples, and firing after printing removes the wax by vaporization or thermal decomposition so that the excess material particulate can be readily removed. The printed part, however, remains because of the presence of silica in selected regions.

Cohesiveness of the layer to be printed can also be obtained by a slight wetting. Small amounts of liquid will wet the particle surfaces and the liquid will segregate preferentially to the next points of contact between the particles. The capillary stress generated by the surface tension of the liquid increases the stress required to separate the particles. Thus, the cohesive strength of the layer is increased significantly with the addition of only small amounts of liquid, i.e. quantities which do not destroy the basically porous nature of the layer. For example, a layer of highly flowable spherical metal particles can be appreciably strengthened by a simple misting with water. Printing can then be effected with latex. After the unprinted regions are removed, the part can be sintered by heat.

Volatile liquids are advantageous in linking or strengthening a powder layer since they reduce accumulation of liquid in the powder beds. A mixture of substances may be used to insure adequate spreading without filling of the interstices. For example, methanol with a small added amount of octanol can be sprayed onto the powder bed. The methanol vaporizes rapidly leaving octanol distributed in a thin layer over the bed. Thus, only a small amount of liquid is left behind in the bed when the next layer of powder is spread.

Other types of linking agents or fixative materials can also be sprayed over the powder surface before printing. Either organic or inorganic fixatives may be used. For example, a small amount of salt dissolved in water can be a very effective fixative after the water is evaporated. Similarly, small amounts of polyvinyl alcohol (PVA) could be dissolved in water. Subsequent firing of the powder bed burns away the fixative but will leave an inorganic binder used to print and define the part. Materials which exhibit a phase change may also be employed instead of solvent removal systems. For example, a warm liquid could be employed which freezes upon contact with the powder bed. An example of such a liquid is 2-methylpropane-2-OL which melts near room temperature. An alternative is to spray two liquids which cross link or gel when in contact. One such mixture is cyanoacrylic monomers and water which rapidly polymerizes upon contact. Another alternative is to incorporate with the spread powder layer a fixative which is activated after spreading. For example, an organic fixative can be included with the powder layer and can then be activated by spraying a solvent onto the layer after spreading. The dissolved fixative material will link the powder particles together as it dries, again while leaving a porous matrix which can be printed in accordance with the present invention. An example of a secondary binder or linking material is a water soluble polymer which can be dissolved by a water mist after the layer is spread. In addition to performing the linking or loose binding function, the material applied to the loose powder can also provide an active chemical function, e.g. it can comprise an acid for triggering gellation the material added during the printing function.

An alternative to strengthening the spread layer of flowable powder is to apply preformed layers or webs of porous particulate materials which are then printed to effect permanent bonding of the particles, both within each layer and from layer to layer. As indicated previously, it is known to cast tapes or sheets of ceramic particles using an organic binder. Such techniques are, for example, conventionally used in the fabrication of electric capacitors. The organic binder acts as a temporary linking or fixative material which provides sufficient integrity of the sheet or tape for handling but is then removed by burning vaporization or chemical means. Such sheets or tapes can be formed as very thin porous layers. Accordingly, by successively placing such sheets over the printing region and then printing each sheet in turn so as to more permanently link the particles within each sheet and to the underlying sheets, a complex part can be built up in a manner essentially analogous to the previous embodiments. A further advantage of using precast webs or sheets is that they can be fabricated using very fine particles which are otherwise difficult to handle.

In addition to the above discussed embodiments of the invention, further variations or modifications of the techniques disclosed above will occur to those in the art. For example, the binder, rather than being applied in a wet state, can be applied in a dry state using materials having a low melting point so that, when applied and heated, the melted material penetrates the powder particles and when hardened bonds them together. Further, two or more different types of powder particles can be applied via two or more separate powder dispersion heads so as to deposit the different powders at different regions of the part being formed. The powder at such regions can then be bonded using the same or different binder materials so that different physical characteristics can be obtained at such different regions. Other modifications or extensions of the invention may occur to those in the art within the spirit and scope thereof. Hence, the invention is not to be construed as limited to the specific embodiments described above, except as defined by the appended claims.

What is claimed is:

1. A process for making a component comprising the steps of
   (1) depositing a preselected quantity of a powder material;
   (2) spreading said powder material in a layer of preselected thickness over a predetermined confined region;
   (3) applying a further material to selected regions of said layer of powder material which will cause said layer of powder material to become bonded at said selected regions;
   (4) repeating steps (1), (2) and (3) a selected number of times to produce a selected number of successive layers, said further material causing said successive layers to become bonded to each other;
   (5) removing unbonded powder material which is not at said one or more selected regions to provide the component.

2. A process as set forth in claim 1 wherein said powder comprises essentially spherical particles.

3. A process as set forth in claim 1 wherein said powder material is spread by an elongate roller traversed over said region.

4. A process as set forth in claim 3 wherein said roller is driven in rotation in a direction opposing the traversing motion.

5. A process as set forth in claim 3 wherein said roller is vibrated.

6. A process as set forth in claim 5 wherein said vibration includes a component normal to said layer.

7. A process as set forth in claim 5 wherein the vibration includes both a component which is longitudinal to said roller and a component which is normal to said layer.

8. A process as set forth in claim 1 wherein said powder material is spread by a doctor blade.

9. A process as set forth in claim 8 wherein said doctor blade is snowplow shaped to shear and roll excess deposited powder.

10. A process for making a component comprising the steps of
  (1) depositing a layer of powder material;
  (2) applying to selected interior regions of said layer of powder material a further material which will cause said layer of powder material to become bonded at said selected regions and applying said further material also to a preselected peripheral region of said layer which will cause the powder material in said preselected peripheral region to become bonded to form a container region;
  (3) repeating steps (1) and (2) a selected number of time to produce a selected number of successive layers, said further material causing said successive layers to become bonded to each other;
  (4) removing said bonded peripheral regions and removing unbonded powder material which is not at said one or more selected regions to provide the component.

11. A process as set forth in claim 10 in which said layer of powder is initially confined in an opening in a platen.

12. A process as set forth in claim 11 wherein previously printed layers are confined by the bonded peripheral region.

13. A process as set forth in claim 10 wherein previously printed layers are lowered prior to printing successive layers.

14. A process as set forth in claim 10 wherein previously printed layers are held stationary and successive layers are formed at successively higher levels.

15. A process for making a component comprising the steps of
  (1) depositing a layer of a porous material having interconnected porosity, said layer being in the form of a preformed web comprising porous material temporarily held together by a first material;
  (2) applying to one or more selected regions of said layer of porous material a further material which will cause said layer of porous material to become bonded at said one or more selected regions;
  (3) repeating steps (1) and (2) a selected number of times to produce a selected number of successive layers, said further material causing said successive layers to become bonded to each other;
  (4) removing both said porous material and said first material which are not at said one or more selected regions to provide the component.

16. A process as set forth in claim 15 wherein said preformed web comprises ceramic particles held together by an organic binder.

17. Apparatus for making a component, said apparatus comprising:
  a hollow cylinder;
  a piston which fits within said cylinder with peripheral clearance;
  means for traversing said piston through said cylinder, said traversing means including means for guiding the travel of said piston independently of said cylinder;
  means for spreading a layer of a powder material over said piston; and
  means for applying a bonding material to selected regions of said layer of powder material.

18. Apparatus as set forth in claim 17 further comprising a compliant seal between said piston and said cylinder.

19. Apparatus as set forth in claim 18 wherein said seal is a fiber seal.

20. Apparatus as set forth in claim 17 wherein said guiding means is a linear bearing.

21. Apparatus as set forth in claim 20 wherein piston is mounted on one end of a plunger with said linear bearing at the other end and wherein said apparatus includes a bellows seal separating said piston from said bearing.

22. Apparatus for dispensing a train of a powder material, said apparatus comprising:
  a sieve drum which is mounted for rotation around an axis which is inclined from the vertical, said drum having an opening at its upper end, the peripheral wall of said drum being perforate;
  means for introducing a quantity of said powder material through said opening; and
  means for rotating said drum around said axis to cause said powder material to be metered out through said peripheral wall.

23. Apparatus as set forth in claim 22 wherein said drum is closed at its lower end.

24. Apparatus as set forth in claim 22 further comprising a housing which peripherally encloses said drum and which provides a funnel like outlet at its bottom so that said housing collects and directs, through said outlet, powder material metered through the peripheral wall of said drum.

25. Apparatus as set forth in claim 24 further comprising means for traversing said drum and housing along one edge of a region over which a layer of said powder material is to be spread thereby to form a line of deposited powder material.

26. Apparatus as set forth in claim 25 further comprising means for spreading said line of deposited powder material across said region.

27. A process for making a component comprising the steps of
  (1) depositing a layer of highly flowable powder material in a confined region;
  (2) applying to said layer a linking material which, at least temporarily, reduces the flowability of said powder material;
  (3) applying to selected regions of said layer a further material which will cause said layer of powder material to become bonded at said selected regions;
  (4) repeating steps (1), (2) and (3) a selected number of times to produce a selected number of successive layers, said further material causing said successive layers to become bonded to each other;
  (5) removing unbonded powder material which is not at said one or more selected regions to provide the component.

28. A process as set forth in claim 27 wherein said linking material is a liquid which links the particles of said powder material by surface tension without eliminating porosity of said layer and which can subsequently be removed to restore the flowability of the powder material in the unbonded regions of each of said layers.

29. A process as set forth in claim 27 wherein said powder material comprises essentially spherical metal particles.

30. A process as set forth in claim 28 wherein said linking material is applied as a fine spray or mist.

31. A process as set forth in claim 30 wherein said linking material is water.

32. A process as set forth in claim 29 wherein said further material is curable organic material.

33. A process as set forth in claim 32 wherein said organic material is burned away during sintering of said powder material.

34. A process as set forth in claim 33 wherein said further material is latex.

35. A process as set forth in claim 27 wherein said powder material comprises essentially spherical particles.

36. A process as set forth in claim 27 wherein said powder material is the product of a spray drying process which increases flowability.

37. A process as set forth in claim 27 wherein said layer is leveled by a doctor blade after step (2).

38. A process as set forth in claim 27 wherein said layer is compacted by a roller after being deposited.

39. A process as set forth in claim 27 wherein the particles of said powder material are coated with an adhesive material which is activated by said linking material.

40. A process as set forth in claim 39 wherein said adhesive material is a polymer which is activated by the application of a mist and can be dissolved by washing to remove the powder material in said unbonded regions in step (5).

41. A process as set forth in claim 40 wherein said mist is water.

42. A process as set forth in claim 27 wherein said linking material is a mixture of a highly volatile liquid and a less volatile liquid.

43. A process as set forth in claim 27 wherein said linking material is a mixture of methanol and octonol.

44. A process for making a component comprising the steps of
 (1) depositing a layer of a powder material in a confined region, said powder material including a first material which, when activated, will temporarily link the particles of powder material to reduce flowability;
 (2) activating said first material;
 (3) applying a further material to selected regions of said layer of powder material which will cause said layer of powder material to become bonded at said selected regions;
 (4) repeating steps (1), (2) and (3) a selected number of times to produce a selected number of successive layers, said further material causing said successive layers to become bonded to each other;
 (5) removing both said first material and unbonded powder material which are not in said one or more selected regions thereby to provide the component.

45. A process as set forth in claim 44 wherein said first material is activated by the application of heat.

46. A process as set forth in claim 44 wherein said first material is activated by the application of a liquid mist.

47. A process for making a component comprising the steps of
 (1) depositing in a confined region a layer of a powder material, said powder material including a material which will cause gellation of preselected colloidal suspensions;
 (2) applying a preselected colloidal suspension to selected regions of said layer of powder material thereby to cause said layer of powder material to become bonded at said selected regions;
 (3) repeating steps (1) and (2) a selected number of times to produce a selected number of successive layers, said further material causing said successive layers to become bonded to each other;
 (4) removing unbonded powder material which is not at said one or more selected regions to provide the component.

48. A process as set forth in claim 47 wherein said colloidal suspension is an alkaline formulation of colloidal silica and said gellation causing material is an acid.

49. A process as set forth in claim 48 wherein said acid is granulated citric acid.

50. A process as set forth in claim 47 wherein said component is further treated by heating.

51. A process as set forth in claim 47 further comprising the step of sintering said component.

52. A process for making a component comprising the steps of
 (1) depositing a preselected quantity of a powder material;
 (2) spreading said powder material in a layer of preselected thickness over a predetermined confined region;
 (3) compacting said layer to reduce its thickness;
 (4) applying a further material to selected regions of said layer of powder material which will cause said layer of powder material to become bonded at said selected regions;
 (5) repeating steps (1) through (4) a selected number of times to produce a selected number of successive layers, said further material causing said successive layers to become bonded to each other;
 (6) removing unbonded powder material which is not at said one or more selected regions to provide the component.

53. A process as set forth in claim 52 wherein said layer is compacted by the application of pressure.

54. A process as set forth in claim 53 wherein said pressure is applied by a roller which is passed over said region.

55. A process as set forth in claim 52 wherein said layer is compacted by surface tension.

56. A process as set forth in claim 55 wherein said surface tension is produced by the application of a liquid to said layer of powder.

57. A process for making a component comprising the steps of
 (1) placing a powder material in a sieve drum having a perforate peripheral wall;
 (2) rotating and traversing said drum over a predetermined region thereby to deposit a layer of said powder material over said region;
 (3) applying a further material to selected regions of said layer of powder material which will cause said layer of powder material to become bonded at said selected regions;

(4) repeating steps (1), (2) and (3) a selected number of times to produce a selected number of successive layers, said further material causing said successive layers to become bonded to each other;

(5) removing unbonded powder material which is not at said one or more selected regions to provide the component.

58. A process as set forth in claim 57 wherein the length of said drum is at least equal to the width of said region and wherein said drum is journaled for rotation around a horizontal axis.

* * * * *